US005849397A

United States Patent [19]

Kohno et al.

[11] Patent Number: 5,849,397

[45] Date of Patent: Dec. 15, 1998

[54] AROMATIC POLYIMIDE FILM AND POLYIMIDE/COPPER FOIL COMPOSITE SHEET

[75] Inventors: Takashi Kohno; Akinori Otani; Toshinori Hosoma; Hiroshi Inoue, all of Yamaguchi, Japan

[73] Assignee: Ube Industries, Ltd., Yamaguchi, Japan

[21] Appl. No.: 720,775

[22] Filed: Oct. 3, 1996

[30] Foreign Application Priority Data

| | | | |
|---|---|---|---|
| Oct. 3, 1995 | [JP] | Japan | 7-256102 |
| Jul. 12, 1996 | [JP] | Japan | 8-183499 |

[51] Int. Cl.$^{6}$ .......... B32B 3/00

[52] U.S. Cl. .......... 428/209; 428/457; 428/473.5; 428/901; 528/188; 528/353

[58] Field of Search .......... 428/209, 457, 428/901, 473.5; 528/188, 353

[56] References Cited

U.S. PATENT DOCUMENTS

| | | | |
|---|---|---|---|
| 4,690,999 | 9/1987 | Numata et al. | 528/188 |
| 4,792,476 | 12/1988 | Numata et al. | 428/209 |
| 4,937,133 | 6/1990 | Watanabe et al. | 428/209 |
| 5,374,469 | 12/1994 | Hino et al. | 428/209 |

*Primary Examiner*—William Krynski
*Assistant Examiner*—Elizabeth Evans
*Attorney, Agent, or Firm*—McAulay Fisher Nissen Goldberg & Kiel, LLP

[57] ABSTRACT

An aromatic polyimide film in the form of a continuous tape having a thickness of 50 to 125 μm favorably employed for manufacture of electric circuit is composed of a biphenyltetracarboxylic acid recurring unit and a p-phenylenediamine recurring unit. The polyimide film has the following characteristics: a tensile strength of not lower than 30 kg/mm$^2$; a tensile modules of not lower than 500 kg/mm$^2$; a linear expansion coefficient of not higher than $2.5\times10^{-5}$ cm/cm/°C.; a heat shrinkage ratio of not higher than 0.05%; a low curling having a maximum curling of not higher than 3 mm for a disk of diameter of 86 mm; and a uniform thickness having a maximum rate of inclination of not more than 3 μm per 10 mm.

11 Claims, 1 Drawing Sheet h

AROMATIC POLYIMIDE FILM AND POLYIMIDE/COPPER FOIL COMPOSITE SHEET

FIELD OF THE INVENTION

The present invention relates to a continuous aromatic polyimide film in the form of a longitudinal tape and a composite sheet comprising the polyimide film and a copper foil.

BACKGROUND OF THE INVENTION

An aromatic polyimide film has a number of excellent characteristics such as a high heat resistance, a high brittle resistance at low temperature, a high chemical resistance, a high electric insulation, a mechanical resistance, and therefore it has been employed for a wide variety of industrial devices such as electronic devices for incorporation into cameras, personal computers, and liquid crystal displays. Particularly, an aromatic polyimide film which comprises a biphenyltetracarboxylic acid recurring unit and a p-phenylenediamine recurring unit is known to have a higher heat resistance as well as a high mechanical strength. Accordingly, an aromatic polyimide film of this type is favorably employed for the preparation of a flexible printed circuit board or as a carrier tape for tape automated bonding (TAB) for the preparation of a IC chip equipped with a circuit printed film.

It has been noted that the tape automated bonding employing the known aromatic film in the form of a continuous tape sometimes encounters troubles in its automated process. For instance, the polyimide film tape does not run smoothly in a machine for TAB, and the required aliment of the polyimide film tape and a copper foil tape sometimes fails. Such troubles are sometimes very serious in the preparation of a printed circuit of high density pattern.

U.S. Pat. No. 4,725,484 discloses a dimensionally stable polyimide film which is of value as a base film of a printed circuit board and two processes for preparing the dimensionally stable polyimide film.

One process comprises the steps of coating a solution of biphenyltetracarboxylic acid and p-phenylene diamine in an organic solvent on a temporary substrate (support) having a plain surface; drying the coated layer to form a solidified film containing a volatile material of 27 to 60 wt. %; peeling the solidified film from the substrate; drying the peeled film at a temperature of 20° to 250° C. under a tension of lower than 100 g/mm$^2$ to give a film containing a volatile material of 5 to 25 wt. %; and finally heating the dried film to 200° to 500° C. under the condition that at least one pair of both the opposite edges of the film are fixed.

Another process comprises the steps of coating a solution of biphenyltetracarboxylic acid and p-phenylene diamine in an organic solvent on a temporary substrate (support) having a plain surface; drying the coated layer to form a solidified film containing a volatile material of 20 to 60 wt. %; peeling the solidified film from the substrate; heating the peeled film to a temperature of 200° to 500° C. under the condition that at least one pair of both the opposite edges of the film are fixed; and finally heat treating the obtained polyimide film to 250° to 500° C., under a tension of lower than 400 g/mm$^2$ for relaxation of stress.

SUMMARY OF THE INVENTION

It is a main object of the present invention to provide an aromatic polyimide film in the form of a continuous tape which can be stably and smoothly run in machines for preparation of printed circuit boards or for performing the tape automated bonding process.

It is another object of the present invention to provide a composite of an aromatic polyimide film and a copper foil both in the form of a continuous tape which can be stably and smoothly run in machines for preparation of printed circuit boards or for performing the tape automated bonding process.

There is provided by the invention an aromatic polyimide film in the form of a continuous tape having a thickness of 50 to 125 $\mu$m (preferably 75 to 125 $\mu$m) and comprising a biphenyltetracarboxylic acid recurring unit and a p-phenylenediamine recurring unit, which has the following characteristics:

- a tensile strength of not lower than 30 kg/mm$^2$;
- a tensile modules of not lower than 500 kg/mm$^2$;
- a linear expansion coefficient of not higher than $2.5\times10^{-5}$ cm/cm/°C., said linear expansion coefficient being measured while the film is heated from 50° to 200° C.;
- a heat shrinkage ratio of not higher than 0.05%, said heat shrinkage ratio being measured by heating the film at 200° C. for 2 hours;
- a maximum curling of not higher than 3 mm, said curling being a height from the center bottom to the peripheral edge which is measured under the condition that the film having been cut to give a disk of a diameter of 86 mm is kept vertically to the horizontal plane by fixing it at its center; and
- a uniform thickness having a maximum rate of inclination of not more than 3 $\mu$m per 10 mm, said rate of inclination being measured in the width direction of the film in the form of continuous tape.

The present invention further provides a composite film comprising the aromatic polyimide film of the invention, an adhesive layer, and a copper foil in order, wherein the curling surface of the polyimide film faces is arranged to be opposite the surface of the copper foil.

DETAILED DESCRIPTION OF THE INVENTION

Figure 1:
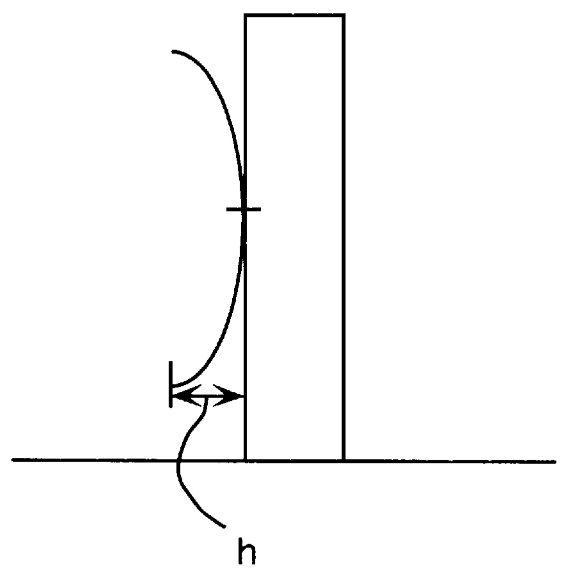
FIG. 1 schematically illustrates an apparatus for measuring the curling of an aromatic polyimide film.

The preferred embodiments of the aromatic polyimide film of the invention are set forth below:

1) The aromatic polyimide film which shows a rate of water absorption of not higher than 1.8%, more preferably 0.2 to 1.7%, said rate of water absorption being measured under the condition that the film is allowed to stand at 23° C. for 24 hours.

2) The aromatic polyimide film, which shows a color difference of not less than 25 (more preferably 25 to 55) for L, not more than 20 (more preferably 5 to 20) for a, and not less than 18 (more preferably 18 to 35) for b, said color difference being measured using a Hunter color difference meter.

3) The aromatic polyimide film, which contains a volatile material in an amount of 0.1 to 0.6 wt. %.

4) The aromatic polyimide film, wherein the tensile strength is in the range of 30 to 50 kg/mm$^2$.

5) The aromatic polyimide film, wherein the tensile modules is in the range of 600 to 1,200 $kg/mm^2$.

6) The aromatic polyimide film, wherein the linear expansion coefficient is in the range of $0.4\times10^{-5}$ to $2.5\times10^{-5}$ cm/cm/°C., more preferably $1.0\times10^{-5}$ to $2.5\times10^{-5}$ cm/cm/°C.

7) The aromatic polyimide film, wherein the curling is 2 mm or less.

8) The aromatic polyimide film, wherein the curling is formed on the surface of the film disk, said surface having smoothness higher than another surface. The smoothness of the surface can be determined and compared using a micrometer or a known roughness measuring apparatus.

9) The aromatic polyimide film, wherein the curling is formed on the surface of the film disk, said surface having been a free surface in the process for the preparation of the film by coating a polyimide precursor dope on a plain temporary substrate.

10) The aromatic polyimide film, wherein the heat shrinkage ratio is in the range of 0.00 to 0.03%.

The film of an aromatic polyimide of the invention comprises a biphenyltetracarboxylic acid recurring unit and a p-phenylenediamine recurring unit. The biphenyltetracarboxylic acid recurring unit preferably is a unit derived from 3,3',4,4'-biphenyltetracarboxylic acid or its derivative (dianhydride, ester, or salt). Other tetracarboxylic acid units such as units derived from pyromellitic acid, any of benzophenonetetracarboxylic acids, and any of naphthalenetetracarboxylic acids can be employed in combination with the biphenyltetracarboxylic acid recurring unit. In the case of using the biphenyltetracarboxylic acid unit in combination with other tetracarboxylic acid unit, the former is preferably employed in a molar amount of not less than 40%, and more preferably not less than 60%.

The p-phenylenediamine recurring unit can be employed in combination with other diamine recurring unit such as that derived from m-phenylenediamine, 4,4'-diaminodiphenyl ether, 4,4'-diaminodiphenylpropane, 4,4'-diaminodiphenylethane, 4,4'-diaminodiphenylmethane, and 4,4'-diaminodphenylsulfide. In the case of using the p-phenylenediamine in combination with other diamine recurring unit, the former is preferably employed in a molar amount of not less than 40%, and more preferably not less than 60%.

The aromatic polyimide film in the form of a continuous tape according to the invention can be prepared by the following process.

Step 1: Preparation of Dope Solution

A biphenyltetracarboxylic acid or its derivative (preferably, biphenyltetracarboxylic acid dianhydride) and p-phenylenediamine are dissolved in an organic polar solvent such as N,N-dimethylacetamide or N-methyl-2-pyrrolidone which is conventionally employed for the preparation of aromatic polyimides. The resulting solution is heated at a temperature of 10° to 80° C. for a period of 1 to 30 hours for undergoing polymerization reaction. Thus, a solution of polyamide acid (or polyamic acid) is obtained. The polyamide acid solution preferably contains the polymer (polyamide acid) in an amount of 15 to 25 wt. % and has a rotary viscosity (at 30° C.) of 500 to 4,500 poise. The obtained polyamide acid preferably has an imidization ratio of not higher than 5% and a logarithmic viscosity (at 30° C., polymer concentration: 0.5 g/100 mL of N-methyl-2-pyrrolidone) of 0.1 to 5.

To the resulting polyamide acid solution is preferably added 0.01 to 1 weight part of a phosphorous-containing compound such as (poly)phosphoric acid ester or an amine salt of phosphoric acid ester to 100 weight parts of the polyamide acid. An inorganic filler (preferably having a mean particle size of 0.005 to 2 $\mu$m) such as colloidal silica also can be added to the polyamide solution in an amount of 0.1 to 3 weight parts per 100 weight parts of the polyamide acid. Thus, the dope solution is obtained.

Step 2: Coating and Solidifying of Dope Solution

The dope solution is coated or spread on a plain surface of a temporary support (or substrate) such as a surface of a metallic drum or a metallic belt, to give a coated solution layer. The solution layer is dried for 1 to 60 minutes in an drying zone comprising a plurality of zones having different drying temperatures within a range of 100° to 160° C., to form a solidified continuous film. The solidified continuous film preferably contains a volatile material (including the solvent and water produced in the reaction) in an amount of 36 to 41 wt. % and has an imidization ratio of 10 to 60%.

Step 3: Peeling of Solidified film

The solidified continuous film is peeled from the temporary support.

Step 4: Further Drying of Peeled Film

Thus peeled solidified continuous film is heated to a temperature of 115° to 160° C. for a period of 0.5 to 10 minutes, preferably under the condition that both sides are not fixed, to give a dry continuous film containing a volatile material in an amount of 13 to 35 wt. % and has an imidization ratio of 20 to 70%.

Step 5: Curing of Dried Continuous Film

The dry continuous film is heated in a curing apparatus for a period of 1 to 50 minutes under the conditions that both sides are fixed by tenters or other means and that the temperature elevates from approximately 100° C. to the highest temperature of 350° to 500° C., to give a continuous polyimide film containing a volatile material in an amount of 0.1 to 0.6 wt. % and has an imidization ratio of not lower than 95%.

Step 6: Relaxation of Continuous Polyimide Film

The continuous polyimide film is heated to a temperature of 200° to 400° C. under tension free or low tension for relaxation of stress.

Step 7: Slitting of Continuous Polyimide Film

The continuous polyimide film is then slitted, if necessary, to give an aromatic polyimide film in the form of a continuous tape of the invention.

In the above-mentioned process, the imidization reaction can be performed in the presence of a chemical imidizing agent at a lower temperature.

The process comprising the above-mentioned plural steps is preferably employed for the preparation of an aromatic polyimide film in the form of a continuous tape having a combination of preferred characteristics according to the invention. The conditions specified in each step should be adjusted to give the desired aromatic polyimide tape in the manner as described in the working examples.

The aromatic polyimide film obtained in the above-mentioned preparation process has no curling or little curling, even though the film has an increased thickness, as compared with the known aromatic polyimide film having a small thickness.

On the aromatic polyimide film in the form of a continuous tape, a copper foil (or other metal foil) in the form of a continuous tape is fixed using a heat-resistant adhesive to give an aromatic film/copper foil composite sheet of the invention. In the production of the composite sheet, the copper foil is preferably arranged on the polyimide film on the side opposite the side having the curling, if the polyimide film has a curling. The surface of the polyimide film can be surface-treated before an adhesive layer is placed thereon. The surface-treating method may be plasma treatment, corona discharge treatment, radiation treatment, and aminosilane coating. The adhesive may be thermoplastic or thermosetting.

The present invention is further described by the following examples. In the examples, the characteristics were measured in the following manner. Every examination was made on at least five samples, and their average value was obtained.

1) Curling

The polyimide film is cut to give a disk having a diameter of 86 mm. The disk is treated for removal of static electricity and placed and fixed vertically in the manner as illustrated in FIG. 1. The height or depth (h) is measured in plural points, and the maximum height (i.e., maximum curling) is determined.

The determined maximum curling is set forth in Table 1, wherein "Curling (A)" means the curling on the surface (A) which was exposed and not in contact with the surface of the temporary substrate, and "Curling (B)" means the curling on the surface (B) which was in contact with the surface of the temporary substrate The surface (A) is more smooth than the surface (B).

2) Maximum rate of inclination for examining uniformity of thickness

Figure 2:
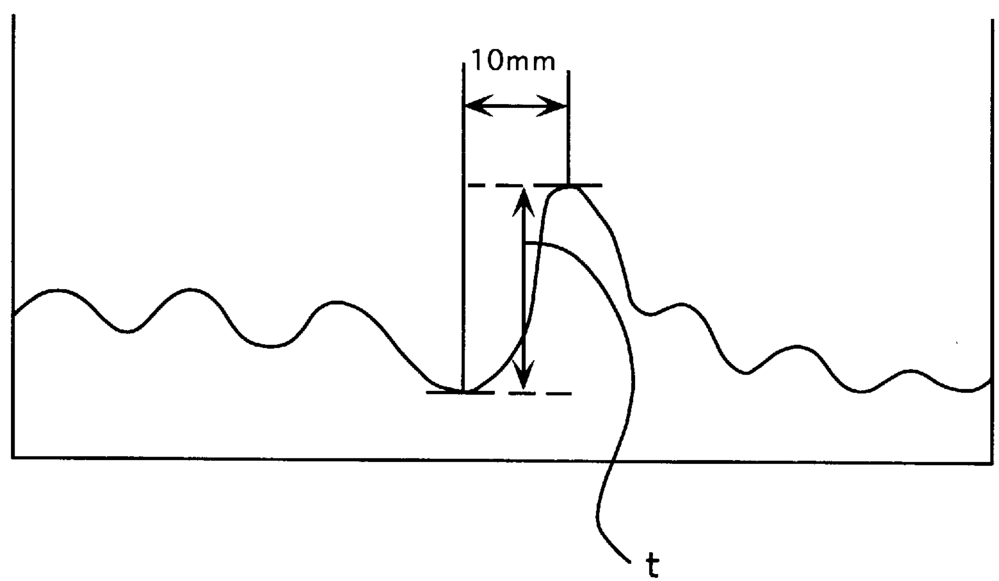
FIG. 2 schematically illustrates the meaning of the maximum rate of inclination of an aromatic polyimide film.

The thickness profile of the continuous polyimide film having a width of 508 mm is obtained in an electronic micrometer (for continuously measuring a film thickness, available from Anritsu Electric Co., Ltd.) by scanning the polyimide film in its width direction. From the thickness profile, the maximum rate of inclination (t) per 10 mm range is determined in terms of "μm" in the manner as illustrated in FIG. 2.

3) Color difference

The color difference is measured in a color difference meter (available from Nippon Denshoku Co., Ltd.) according to the Hunter color difference method and indicated in terms of L, a, and b, in which a larger L means higher brightness; the "a" means degree of red color when it is on (+) side, while degree of green color when it is on (−) side, and the "b" means degree of yellow color when it is on (+) side, while degree of blue color when it is on (−). No mark means a value on the (+) side.

4) Water absorption

The water absorption is measured according to ASTM D 570-63 (at 23° C., for 24 hours).

5) Tensile strength

The tensile strength is measured according to ASTM D 882-64T (MD, machine direction=longitudinal direction), 6) Tensile modules The tensile modules is measured according to ASTM D 882-64T (MD).

7) Linear expansion coefficient

The linear expansion coefficient is measured while the film is heated from 50° to 200° C. in a TMA apparatus (under the condition of tensile mode, 2 g weight, sample length 10 mm, 20° C./min.), after the film is heated at 300° C. for 30 min., for relaxation of stress.

8) Heat shrinkage ratio

The film is cut to give a square specimen (80 mm×80 mm) which is then allowed to stand under standard conditions (23±2° C., 65±5% RH) for 24 hours. The specimen was given marks to indicate the predetermined distance, and then is heated at 200° C. for 2 hours. The heated film is allowed to stand under the standard conditions for 24 hours. The distance of the marks is again measured to obtain the heat shrinkage ratio according to the following formula:

$$\text{Heat shrinkage ratio}=[(L_1-L_2)/L_1]\times 100$$

$L_1$: distance (mm) between the marks before heating $L_2$: distance (mm) between the marks after heating 9) Imidization ratio The imidization ratio is determined by the known FI-IR (ATR method) utilizing the ratio of light absorbance at 1510 $cm^{-1}$ to light absorbance of 1780 $cm^{-1}$. The surface (A) of the film is used for the determination of imidization ratio.

10) Content of volatile $$\text{Content of volatile}=[(A-B)/A]\times 100$$

A: weight of film before heating

B: weight of film after heating at 420° C. for 20 minutes

11) Content of residual volatile material

The amount of volatile material in the finally obtained polyimide film is determined by the following formula:

$$\text{Content of residual volatile}=[(C-D)/C]\times 100$$

C: weight after drying at 150° C. for 10 minutes

D: weight after heating at 450° C. for 20 minutes

COMPARISON EXAMPLE 1

In a 100 L-volume polymerization vessel, 54.6 kg of N,N-dimethylacetamide, 8.826 kg of 3,3',4,4'-biphenyltetracarboxylic acid dianhydride, and 3.243 kg of p-phenylenediamine were successively placed. The solution was heated to 30° C. for 10 hours to perform polymerization reaction, to give a polyamide acid solution (polymer content: 18 wt. %). The polyamide acid had an imidization ratio of less than 5%, and shows a logarithmic viscosity of 1.60 (determined at 30° C., concentration: 0.5 g/100 mL of N,N-dimethylacetamide). To the polyamide acid solution were added 0.1 weight part of triethanol amine salt of monostearylphosphoric acid ester and 0.5 weight part (solid content base) of colloidal silica (mean particle size: 0.08 μm) per 100 weight parts of the polyamide acid. The mixture was stirred to give a dope solution having a rotary viscosity of 3,000 poise.

The dope solution was continuously extruded from the slit of T die onto a support having a smooth surface in a casting-drying oven (between the entrance and the exit, a number of drying zones are provided). The extruded dope solution on the support was conveyed in the oven under heating at 142° C. (in the first zone) and at 145° C. (in the last zone), for a retention period of 15 minutes, to give a solidified continuous film on the support. The solidified continuous film had a volatile content of 34 wt. %, and an imidization ratio of 34%.

The solidified continuous film was peeled from the support, and heated at 145° C. (average temperature) for 2 minutes in an oven for drying the film under the condition that both side edges were free (not fixed). Thus dried film had a volatile content of 26 wt. % and an imidization ratio of 35%.

The dried film was passed through a curing oven (temperature at entrance: 140° C., highest temperature 480° C., temperature at exit: 150° C.) under the conditions that both side edges were fixed by tenters and the retention was done for 15 minutes, to further dry and cure continuously to give a continuous polyimide film (width: 508 mm, thickness: 75 μm, amount of residual volatile material: 0.25 wt. %, imidization ratio: higher than 95%).

The obtained continuous polyimide film was then supplied into a heating over of vertical type under a tension of 80 g/mm$^2$ in the longitudinal direction and heated to 325° C. for 3 minutes in the oven for relaxation of stress remaining in the film.

COMPARISON EXAMPLE 2

The dope solution prepared in the same manner as in Comparison Example 1 was continuously extruded on a support having a smooth surface in a casting-drying oven having a number of drying zones. The extruded dope solution on the support was conveyed in the oven under heating at 135° C. (average temperature in all zones) and at 140° C. (in the last zone), for a retention period of 15 minutes, to form a solidified continuous film on the support. The solidified continuous film had a volatile content of 42 wt. %, and an imidization ratio of 26%.

The solidified continuous film was peeled from the support, and heated at 145° C. (average temperature) for 2 minutes in an oven for drying the film under the condition that both side edges were free. Thus dried film had a volatile content of 33 wt. % and an imidization ratio of 30%.

The dried film was passed through a curing oven (temperature at entrance: 140° C., highest temperature: 480° C., temperature at exit: 150° C.) under the conditions that both side edges were fixed by tenters and the retention was made for 15 minutes to further dry and cure continuously, to give a continuous polyimide film (width: 508 mm, thickness: 75 μm, amount of residual volatile material: 0.30 wt. %, imidization ratio: higher than 95%).

The obtained continuous polyimide film was then heated for relaxation of stress in the same manner as in Comparison Example 1.

COMPARISON EXAMPLE 3

In a 100 L-volume polymerization vessel, 48.3 kg of N,N-dimethylacetamide, 8.826 kg of 3,3',4,4'-biphenyltetracarboxylic acid dianhydride, and 3.243 kg of p-phenylenediamine were successively placed. The solution was heated to 30° C. for 10 hours to perform polymerization reaction, to give a polyamide acid solution (polymer content: 20 wt. %). The polyamide acid had an imidization ratio of less than 5%, and shows a logarithmic viscosity of 1.50 (determined at 30° C., content: 0.5 g/100 mL of N-methyl-2-pyrrolidone). To the polyamide acid solution were added 0.1 weight part of triethanol amine salt of monostearylphosphoric acid ester and 0.5 weight part (solid content base) of colloidal silica (mean particle size: 0.08 μm) per 100 weight parts of the polyamide acid. The mixture was stirred to give a dope solution having a rotary viscosity of 5,000 poise.

The dope solution was processed in the same manner as in Comparison Example 1 to produce a solidified continuous film on the support. The solidified film had a volatile content of 33 wt. %, and an imidization ratio of 33%.

The solidified continuous film was peeled from the support, and heated at 145° C. (average temperature) for 2 minutes in an oven for drying the film under the condition that both side edges were free. Thus dried film had a volatile content of 24 wt. % and an imidization ratio of 35%.

The dried film was passed through a curing oven (temperature at entrance: 140° C., highest temperature: 480° C., temperature at exit: 150° C.) in the same manner as in Comparison Example 1 to further dry and cure continuously to give a continuous polyimide film (width: 508 mm, thickness: 75 μm, amount of residual volatile material: 0.29 wt. %, imidization ratio: higher than 95%).

The obtained continuous polyimide film was then heated for relaxation of stress in the same manner as in Comparison Example 1.

COMPARISON EXAMPLE 4

The polymerization reaction of Comparison Example 1 was repeated except that 3.243 kg of p-phenylendiamine was replaced with 6.007 kg of 4,4'-diaminodiphenyl ether and that the amount of N,N-dimethylacetamide was changed from 54.6 kg to 67.6 kg.

The dope solution obtained from the polymerization reaction solution was processed in the same manner as in Comparison Example 1 to give a continuous polyimide film (so called Type R, width: 508 mm, thickness: 75 μm, amount of residual volatile material: 0.61 wt. %, imidization ratio: higher than 95%).

The obtained continuous polyimide film was then heated for relaxation of stress in the same manner as in Comparison Example 1.

EXAMPLE 1

The dope solution prepared in the same manner as in Comparison Example 1 was continuously extruded onto a support having a smooth surface in a casting-drying oven having a number of drying zones. The extruded dope solution on the support was conveyed in the oven under heating at 138° C. (average temperature in all zones) and at 142° C. (in the last zone), for a retention period of 15 minutes, to form a solidified continuous film on the support. The solidified continuous film had a volatile content of 39 wt. %, and an imidization ratio of 29%.

The solidified continuous film was peeled from the support, and heated at 145° C. (average temperature) for 2 minutes in an oven for drying the film under the condition that both side edges were free. Thus dried film had a volatile content of 29 wt. % and an imidization ratio of 32%.

The dried film was passed through a curing oven (temperature at entrance: 140° C., highest temperature: 480° C., temperature at exit: 150° C.) under the conditions that both side edges were fixed by tenters and the retention was made for 15 minutes to further dry and cure continuously, to give a continuous polyimide film (width: 508 mm, thickness: 75 μm, amount of residual volatile material: 0.26 wt. % imidization ratio: higher than 95%).

The obtained continuous polyimide film was then heated for relaxation of stress in the same manner as in Comparison Example 1.

EXAMPLE 2

The dope solution prepared in the same manner as in Comparison Example 1 was continuously extruded on a support having a smooth surface in a casting-drying oven having a number of drying zones. The extruded dope solution on the support was conveyed in the oven under heating at 140° C. (average temperature in all zones) and at 150° C. (in the last zone), for a retention period of 10 minutes, to form a solidified continuous thinner film on the support. The solidified continuous film had a volatile content of 40 wt. %, and an imidization ratio of 24%.

The solidified film was peeled from the support, and heated at 140° C. (average temperature) for 2 minutes in an oven for drying the film under the condition that both side edges were free. Thus dried film had a volatile content of 27 wt. % and an imidization ratio of 31%.

The dried film was passed through a curing oven (temperature at entrance: 110° C., highest temperature: 480° C., temperature at exit: 150° C.) under the conditions that both side edges were fixed by tenters and the retention was made for 10 minutes to further dry and cure continuously, to give a continuous polyimide film (width: 508 mm, thickness: 50 μm, amount of residual volatile material: 0.17 wt. %, imidization ratio: higher than 95%).

The obtained continuous polyimide film was then heated for relaxation of stress in the same manner as in Comparison Example 1.

EXAMPLE 3

The dope solution prepared in the same manner as in Comparison Example 1 was continuously extruded on a support having a smooth surface in a casting-drying oven having a number of drying zones. The extruded dope solution on the support was conveyed in the oven under heating at 134° C. (average temperature in all zones) and at 138° C. (in the last zone), for a retention period of 30 minutes, to form a solidified continuous film on the support. The solidified continuous film had a volatile content of 37 wt. %, and an imidization ratio of 30%.

The solidified film was peeled from the support, and heated at 120° C. (average temperature) for 5 minutes in an oven for drying the film under the condition that both side edges were free. Thus dried film had a volatile content of 33 wt. % and an imidization ratio of 32%.

The dried film was passed through a curing oven (temperature at entrance: 140° C., highest temperature: 480° C., temperature at exit: 150° C.) under the conditions that both side edges were fixed by tenters and the retention was made for 30 minutes to further dry and cure continuously, to give a continuous polyimide film (width: 508 mm, thickness: 125 μm, amount of residual volatile material: 0.51 wt. %, imidization ratio: higher than 95%).

The obtained continuous polyimide film was then heated for relaxation of stress in the same manner as in Comparison Example 1.

EXAMPLE 4

The dope solution prepared in the same manner as in Comparison Example 1 was continuously extruded on a support having a smooth surface in a casting-drying oven having a number of drying zones. The extruded dope solution on the support was conveyed in the oven under heating at 138° C. (average temperature in all zones) and at 140° C. (in the last zone), for a retention period of 15 minutes, to form a solidified continuous film on the support. The solidified continuous film had a volatile content of 41 wt. %, and an imidization ratio of 27%.

The solidified film was peeled from the support, and heated at 145° C. (average temperature) for 2 minutes in an oven for drying the film under the condition that both side edges were free. Thus dried film had a volatile content of 31 wt. %, and an imidization ratio of 32%.

The dried film was passed through a curing oven (temperature at entrance: 140° C., highest temperature: 480° C., temperature at exit: 150° C.) under the conditions that both side edges were fixed by tenters and the retention was made for 15 minutes to further dry and cure continuously, to give a continuous polyimide film (width: 508 mm, thickness: 75 μm, amount of residual volatile material: 0.30 wt. %, imidization ratio: higher than 95%).

The obtained continuous polyimide film was then heated for relaxation of stress in the same manner as in Comparison Example 1.

EXAMPLE 5

The polymerization reaction of Comparison Example 1 was repeated except for using 53.6 kg of N,N-dimethylacetamide, 2.27 kg of p-phenylendiamine, 1.802 kg of 4,4'-diaminodiphenyl ether, 4.413 kg of 3,3',4,4'-biphenyltetracarboxylic acid dianhydride, and 3.272 kg of pyromellitic acid dianhydride, to give a polyamide acid solution (polymer content 18 wt. %) showing a rotary viscosity of 1,400 poise. The polyamide acid solution was then processed in the same manner as in Comparison Example 1 to give a dope solution.

The dope solution was continuously extruded on a support having a smooth surface in a casting-drying oven having a number of drying zones, in the same manner as in Comparison Example 1. The extruded dope solution on the support was conveyed in the oven under heating at 138° C. (average temperature in all zones) and at 140° C. (in the last zone), for a retention period of 10 minutes, to form a solidified continuous film on the support. The solidified continuous film had a volatile content of 40 wt. %, and an imidization ratio of 25%.

The solidified film was peeled from the support, and heated at 140° C. (average temperature) for 2 minutes in an oven for drying the film under the condition that both side edges were free. Thus dried film had a volatile content of 31 wt. % and an imidization ratio of 29%.

The dried film was passed through a curing oven (temperature at entrance: 140° C., highest temperature: 440° C., temperature at exit: 150° C.) under the conditions that both side edges were fixed by tenters and the retention was made for 10 minutes to further dry an cure continuously, to give a continuous polyimide film (width: 508 mm, thickness: 50 μm, amount of residual volatile material: 0.18 wt. %, imidization ratio: higher than 95%).

The obtained continuous polyimide film was then heated for relaxation of stress in the same manner as in Comparison Example 1.

EXAMPLE 6

The surface of the continuous polyimide film prepared in Example 4, the surface having been in contact with the support in the preparing process, that is, surface (B), was subjected to low temperature plasma surface treatment (period of plasma treatment: one hour, microwave oscillation power: 1 kW, pressure (for plasma generation): 0.8 Torr, surrounding gas: oxygen).

[Evaluation of Continuous Polyimide Film]

1) Physical characteristics

The continuous polyimide film obtained in each of Comparison Examples and Examples was measured in its physical characteristics according to the aforementioned methods. The results are set forth in Table 1.

2) Running stability

The continuous polyimide film was cut and slit to give a tape having a width of 35 mm and a length of 50 m. There were observed no problems in the slitting procedure so long as the polyimide films of Comparison Examples 1, 2 and 4, and Examples 1–6. However, there was observed a trouble in the polyimide film of Comparison Example 3 when the tape after slitting is rewound up.

In the description of the specification, the surface which had been in contact with the temporary support in the preparation of the continuous polyimide film was named "(B)", while the surface which had been exposed (that is, not in contact with the temporary support) was name "(A)".

Independently, an adhesive tape (width: 26 mm) having on a polyethylene terephthalate film a thermosetting adhesive composition in the B-stage (Tg: 130° C.) which comprised 50 weight parts of polyimide-siloxane, 30 weight parts of epoxy resin (Epikote 807, available from Yuka Shell Epoxy Co., Ltd.), 20 weight parts of phenol-novolak curable material (H-1, available from Meiwa Kasei Co., Ltd.), and 0.01 weight part of a curing catalyst (2-phenylimidazole) was produced.

On the surface (B) of the previously prepared polyimide tape was placed under pressure the adhesive layer of the adhesive tape under the condition that the center lines of both tapes were aligned, to give a polyimide tape provided with an adhesive layer (a laminate of polyethylene terephthalate film/adhesive layer/aromatic polyimide film).

The laminate was punched to have sprocket holes and device holes thereon. The polyethylene terephthalate film was peeled from the laminate, and on the adhesive layer of the laminate was placed a copper foil (thickness: 35 μm). The resulting laminate of polyimide film/adhesive layer/copper foil was passed through rollers at a temperature of 130° C. and at a pressure of 2 kg/cm$^2$, for approximately one minute, to give a composite tape of polyimide film/adhesive layer/copper foil. The copper foil on the composite tape was subjected to patterning-etching to form a circuit having inner leads and outer leads on the copper foil.

Thus processed composite tape, that is, a carrier tape for tape automated bonding was run in a tape automated bonding machine to check whether any running troubles were observed or not. The results are set forth in Table 1, in which AA, BB and CC mean the following results:

CC: running troubles such as those caused by running out of tracks due to wrongly leaving from sprockets or due to wrongly sticking to sprockets were often observed;

BB: running troubles such as those mentioned above were sometimes (not often) observed; and AA: no running troubles are observed.

3) Curling of composite tape

The composite tape was cut to have a length of 70 mm, and placed on a horizontally set plate under the condition that the curling surface faced plate. The height of curling was then measured, to give the following ranking;

AA: height of curling is less than 2.0 mm;

BB: height of curling is in the range of 2.0 to 2.5 mm; and

CC: height of curling is more than 2.5 mm.

4) Alignment

The alignment was examined in the tape automated bonding machine to give the following ranking:

AA: precise alignment was done, with no deformation of leads;

BB: alignment was done with slight difference and slight deformation of leads; and CC: alignment was sometimes wrong and deformation was observed.

TABLE 1

| | Comparison Example | | | | Example of Invention | | | | | |
|---|---|---|---|---|---|---|---|---|---|---|
| No. | 1 | 2 | 3 | 4 | 1 | 2 | 3 | 4 | 5 | 6 |
| Thickness (μm) | 75 | 75 | 75 | 75 | 75 | 50 | 125 | 75 | 50 | 75 |
| Curling | B4 | A6 | B5 | B2 | A0 | A2 | A1 | A2 | A2 | A2 |
| Rate of Inclination (μm/10 mm) | 1.8 | 1.8 | 3.1 | 1.7 | 1.7 | 1.5 | 1.9 | 1.6 | 1.5 | 1.6 |
| Color | | | | | | | | | | |
| L | 35.1 | 27.0 | 35.0 | 70.2 | 34.8 | 49.3 | 30.0 | 34.3 | 49.7 | 34.0 |
| a | 16.6 | 21.1 | 16.7 | −3.9 | 16.8 | 9.6 | 19.8 | 17.1 | 11.4 | 16.9 |
| b | 23.5 | 18.0 | 23.6 | 37.3 | 23.4 | 30.5 | 20.5 | 22.9 | 33.2 | 22.7 |
| Water Absorption (%) | 1.5 | 1.5 | 1.5 | 1.5 | 1.5 | 1.5 | 1.4 | 1.5 | 1.5 | 1.5 |
| Tensile strength (kg/mm$^2$) | 32.9 | 34.8 | 33.5 | 37.2 | 35.2 | 43.3 | 31.4 | 35.5 | 37.1 | 35.1 |
| Tensile modules (kg/mm$^2$) | 650 | 680 | 660 | 360 | 680 | 860 | 660 | 690 | 505 | 688 |
| Linear expansion coefficient (× $10^{-5}$/°C.) | 2.2 | 2.1 | 2.1 | 4.3 | 2.1 | 1.6 | 2.1 | 2.1 | 2.2 | 2.0 |
| Heat shrinkage ratio (%) | 0.02 | 0.02 | 0.02 | 0.15 | 0.02 | 0.01 | 0.01 | 0.02 | 0.03 | 0.02 |
| Peel strength(90°) (kg/cm) | 1.4 | 1.3 | 1.3 | 1.2 | 1.4 | 1.3 | 1.3 | 1.4 | 1.2 | 1.6 |
| Running stability | CC | BB | CC | CC | AA | AA | AA | AA | AA | AA |
| Composite curling | CC | CC | CC | CC | AA | AA | AA | AA | AA | AA |
| Alignment | BB | CC | BB | CC | AA | AA | AA | AA | AA | AA |
| Ranking | CC | CC | CC | CC | AA | AA | AA | AA | AA | AA |

What is claimed is:

1. A continuous aromatic polyimide film having a thickness of 50 to 125 μm and comprising a biphenyltetracarboxylic acid recurring unit and a p-phenylenediamine recurring unit, which has the following characteristics:

a tensile strength of not lower than 30 kg/mm$^2$;

a tensile modules of not lower than 500 kg/mm$^2$;

a linear expansion coefficient of not higher than $2.5\times10^{-5}$ cm/cm/°C., said linear expansion coefficient being measured while the film is heated from 50° to 200° C.;

a heat shrinkage ratio of not higher than 0.05%, said heat shrinkage ratio being measured by heating the film at 200° C. for 2 hours;

a maximum curling of not higher than 3 mm, said curling being a height from the center bottom to the peripheral edge which is measured under the condition that the film having been cut to give a disk of a diameter of 86 mm is kept vertically to the horizontal plane by fixing it at its center; and a uniform thickness having a maximum rate of inclination of not more than 3 $\mu$m per 10 mm, said rate of inclination being measured in the width direction of the film in the form of continuous tape.

2. The aromatic polyimide film of claim 1, which shows a rate of water absorption of not higher than 1.8%, said rate of water absorption being measured under the condition that the film is allowed to stand at 23° C. for 24 hours.

3. The aromatic polyimide film of claim 1, which shows a color difference of not less than 25 for L, not more than 20 for a, and not less than 18 for b, said color difference being measured using a Hunter color difference meter.

4. The aromatic polyimide film of claim 1, which contains a volatile material in an amount of 0.1 to 0.6 wt. %.

5. The aromatic polyimide film of claim 1, wherein the tensile strength is in the range of 30 to 50 kg/mm$^2$.

6. The aromatic polyimide film of claim 1, wherein the tensile modules is in the range of 600 to 1,200 kg/mm$^2$.

7. The aromatic polyimide film of claim 1, wherein the linear expansion coefficient is in the range of $0.4\times10^{-5}$ to $2.5\times10^{-5}$ cm/cm/°C.

8. The aromatic polyimide film of claim 1, wherein the curling is 2 mm or less.

9. The aromatic polyimide film of claim 1, wherein the curling is formed on the surface of the film disk, said surface having smoothness higher than another surface.

10. The aromatic polyimide film of claim 1, wherein the curling is formed on the surface of the film disk, said surface having been a free surface in the process for the preparation of the film by coating a polyimide precursor dope on a plain temporary substrate.

11. A composite film comprising the aromatic polyimide film of claim 1, an adhesive layer, and a copper foil in order, wherein the curling surface of the polyimide film faces is arranged to take a place opposite the surface of the copper foil.

* * * * *